United States Patent
Chang et al.

(10) Patent No.: US 10,384,311 B2
(45) Date of Patent: Aug. 20, 2019

(54) SPINNING ROLLER SURFACE LASER REINFORCED PROCESSING FORMING METHOD

(71) Applicant: CITIC Dicastal CO., LTD., Qinhuangdao, Hebei (CN)

(72) Inventors: Haiping Chang, Qinhuangdao (CN); Zhixue Wang, Qinhuangdao (CN); Shiyou Gao, Qinhuangdao (CN); Jin Zhang, Qinhuangdao (CN); Rui Li, Qinhuangdao (CN); Dawei Xu, Qinhuangdao (CN); Donghui Zhang, Qinhuangdao (CN)

(73) Assignee: CITIC Dicastal CO., LTD., Qinhuangdao (CN)

( * ) Notice: Subject to any disclaimer, the term of this patent is extended or adjusted under 35 U.S.C. 154(b) by 0 days.

(21) Appl. No.: 15/688,906

(22) Filed: Aug. 29, 2017

(65) Prior Publication Data
US 2018/0333802 A1 Nov. 22, 2018

(30) Foreign Application Priority Data
May 22, 2017 (CN) .......................... 2017 1 0361712

(51) Int. Cl.
| | |
|---|---|
| *B23K 26/352* | (2014.01) |
| *B23K 26/34* | (2014.01) |
| *C23C 24/10* | (2006.01) |
| *C23C 4/04* | (2006.01) |
| *C23C 16/48* | (2006.01) |

(52) U.S. Cl.
CPC ............ *B23K 26/352* (2015.10); *B23K 26/34* (2013.01); *C23C 24/103* (2013.01); *C23C 4/04* (2013.01); *C23C 16/483* (2013.01)

(58) Field of Classification Search
CPC ...... C23C 24/013; C23C 24/106; B23K 26/60; B23K 26/144; B23K 26/352
See application file for complete search history.

(56) References Cited

U.S. PATENT DOCUMENTS 9,316,341 B2 * 4/2016 Kusinski ................. F16L 58/08

FOREIGN PATENT DOCUMENTS

| CN | 104762617 A | 7/2015 |
|---|---|---|
| CN | 105506530 A | 4/2016 |

* cited by examiner

*Primary Examiner* — Michael P Wieczorek
(74) *Attorney, Agent, or Firm* — Cooper Legal Group, LLC

(57) ABSTRACT

A spinning roller surface laser reinforced processing forming method is provided. A spinning roller is normalized after forging, the normalizing temperature is controlled to 860-880 DEG C., and the heat preservation time is 40-60 minutes; the spinning roller forging blank is roughly processed to reserve a tolerance allowance of 0.5 mm on the designated working face; the spinning roller and workpiece contact surface reinforcing layer is made of Ni625+WC2, in which WC is more than 22%; a reinforcing layer having the thickness of 0.8 mm is clad with laser on the working face of the spinning roller, and the preheating temperature is controlled to 250-400 DEG C. before welding; the spinning roller laser clad reinforcing layer is rolled; and the rolled spinning roller is put into a thermal treatment furnace for thermal treatment, and quenching and tempering treatment, re-crystallization and residual stress elimination are performed.

4 Claims, 1 Drawing Sheet

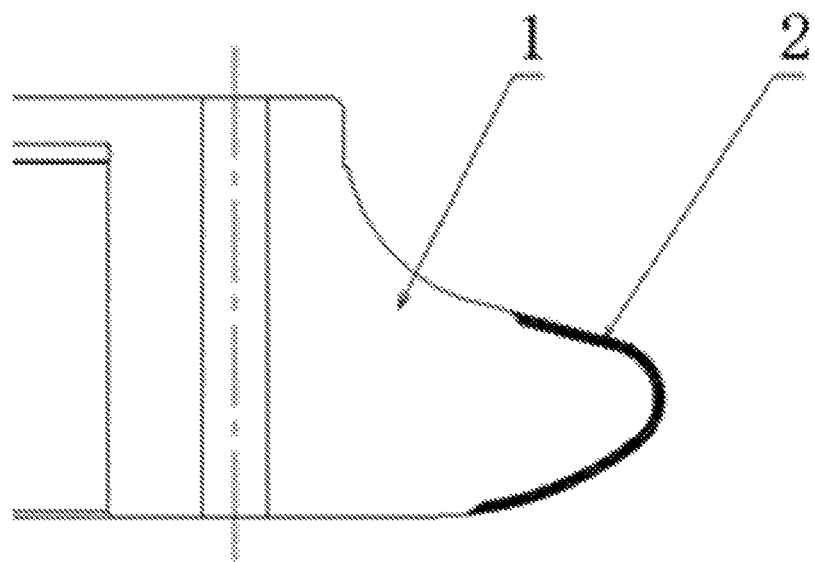

SPINNING ROLLER SURFACE LASER REINFORCED PROCESSING FORMING METHOD

CROSS-REFERENCE TO RELATED APPLICATIONS

This application is filed based upon and claims priority to Chinese Patent Application No. 201710361712.X, filed on May 22, 2017, the entire contents of which are incorporated herein by reference.

BACKGROUND

Cast spun (cast+spun) aluminum alloy hubs are universally applied in the field of cars due to the advantages of quick heat dissipation, light weight, energy conservation, good comfort, attractive appearance and the like. During processing, the spoke and the thick and large rim are formed by low pressure casting, and then the cast rim is processed to the appropriate size and shape via strong hot spinning. After hot spinning, most metal grains of the rim are thinned, and the rim has obvious fiber textures, so that the overall strength and corrosion resistance of the wheel are greatly improved. The power spinning process for the rim belongs to thinning spinning, and the deformation process is divided into a plurality of steps according to the deformation degree, that is, a plurality of spinning rollers are matched and move according to certain staggered distance and trajectory, so that the spun workpieces meet the requirements for size and quality.

During spinning, the spinning rollers and the high-temperature workpieces produce strong high-speed friction, the rotating speeds of the workpieces are 800 revolutions per minute, and the spinning rollers must keep the dimensional precision and the surface roughness under such condition so as not to fail early. The failing spinning roller leads to texture deformation and non-uniformity, performance decline and poor consistency of the spun part.

It is required that the spinning roller material can bear mechanical wear and a thin and closely attached oxide film can be formed on the friction surface of the spinning roller to keep a lubricating effect, thereby preventing adhesion between the spinning roller and the surface of the processed workpiece, and reducing damage caused by further oxidation of the surface of the spinning roller. As for a spinning roller working at a high temperature under a strong impact load, its high-temperature toughness at the working temperature must be considered.

Patents CN105506530A, titled Surface Composite Reinforcing Method for Mold and CN104762617A, titled Laser Repair Method for Mold disclosed by the State Intellectual Property Office disclose treatment of a laser cladding technology and an induction cladding and rolling hardening combined technology on the surfaces of molds. These technologies are not perfect enough for hardening spinning rollers in high-temperature and high-speed powerful friction, and may cause the phenomena of hardening layer drop, low strength, surface corrosion pits and the like. In order to improve the wear resistance, strength and toughness of the high-speed and high-speed spinning rollers, appropriate materials and reasonable production processes and thermal treatment methods are needed, so that the spinning rollers have high hardness, the composition, morphology and distribution of hardening phases such as carbides and the like in the materials are reasonable, corrosion can be prevented, good weldability is achieved, and the texture uniformity and performance consistency of the spun parts of the workpieces can thus be improved.

SUMMARY

The disclosure relates to the field of automobile hub manufacture, and specifically, relates to a surface reinforcing method for a cast spun aluminum alloy hub forming spinning roller.

The disclosure is aimed at providing a spinning roller surface reinforced forming processing method, which combines laser cladding, rolling and thermal treatment technologies together, thereby keeping the dimensional precision and surface roughness of a spinning roller in high-temperature and high-speed contact friction, allowing the spinning roller to bear its mechanical wear, preventing the defects of corrosion pits, small cracks, aluminum pickup and the like on the surface of the spinning roller, prolonging the service life of the spinning roller, reducing the aluminum pickup polishing time for the spinning roller, improving the production efficiency, reducing the manufacturing cost and improving the performance consistency.

In order to solve the above technical problems, the disclosure adopts the following technical solution: a 35CrMo steel forging blank with good weldability substitutes H13 steel and is used as the spinning roller blank of a new spinning roller for a wheel, the spinning roller is normalized after forging, the normalizing temperature is controlled to 860-880 DEG C., the heat preservation time is 40-60 minutes, and the spinning roller is cooled in air after being discharged; and the 35CrMo steel has high creep strength and persistent strength at a high temperature, and has high static strength, impact toughness and fatigue strength and good hardenability.

The new spinning roller forging blank is roughly processed to reserve a tolerance allowance of 0.5 mm on the designated working face.

The new spinning roller and workpiece contact surface reinforcing layer is made of Ni625+WC2, in which WC is more than 22%, and the Ni625 high-temperature alloy has the properties of corrosion resistance to various corrosive media in oxidation and reduction environments, good processability and weldability, no post-welding cracking sensitivity and the like.

A reinforcing layer having the thickness of 0.8 mm is clad with laser on the designated working face of the new spinning roller, the preheating temperature is controlled to 250-400 DEG C. before welding, and the laser process parameters include: laser power: 1800-5000 W; scanning speed: 3-10 mm/s; spot diameter: 3-6 mm; overlapping rate: 30-50%; powder feeding rate: 5-15 g/min.

The new spinning roller laser clad reinforcing layer is rolled at the temperature of 1120-1160 DEG C. under the force of 4-5 tons, so that the uniformity of the forged structure of the laser clad layer is effectively ensured and the residual tension stress is converted into residual compressive stress.

The rolled new spinning roller is put into a thermal treatment furnace for thermal treatment, and quenching and tempering treatment, re-crystallization and residual stress elimination are performed, in which the thermal treatment is performed stage by stage, the first heating temperature is 520-550 DEG C., the heat preservation time is 1-1.2 hours, the second temperature is raised to 820-880 DEG C. within 0.5-1.3 hours, the heat is finally preserved for 1.5-2.5 hours, the quenching temperature is 850 DEG C., the quenching time is 0.5 hour, the tempering temperature is 500-560 DEG C., the tempering time is 0.8-1.2 hours, and the medium is oil.

The new spinning roller after thermal treatment is finished to process the part except the working face reinforcing layer to the dimension and precision required by a spinning roller drawing; and the working face of the finished new spinning roller is ground to the dimension and precision required by the spinning roller drawing.

Compared with the prior art, the disclosure has the advantages: (1) laser cladding, rolling and thermal treatment technologies are combined for the first time, so that surface reinforcement of the high-speed and high-temperature spinning roller is realized, the hardness of the reinforcing layer can reach over HRC80, and the service life of the spinning roller is prolonged; (2) by adopting the rolling and thermal treatment technologies, the impact toughness, metal structure and corrosion resistance of the spinning roller are improved; and (3) the process is suitable for the field of processing formation of high-speed and high-temperature spinning rollers and the like, is simple, and has good promotion value.

BRIEF DESCRIPTION OF THE DRAWINGS

FIG. 1 is a schematic diagram of laser reinforced forming of a new spinning roller.

In which: 1—new spinning roller 35CrMo steel forging blank, 2—new spinning roller surface hardening surface Ni625+WC.

DETAILED DESCRIPTION

The technical solution of the disclosure will be further specified below via embodiments in combination with the accompanying drawing.

Embodiment 1

A 35CrMo steel forging blank 1 with good weldability substitutes H13 steel and is used as the spinning roller blank of a new spinning roller for a wheel, the spinning roller is normalized after forging, the normalizing temperature is controlled to 860 DEG C., the heat preservation time is 60 minutes, and the spinning roller is cooled in air after being discharged.

The new spinning roller forging blank is roughly processed to reserve a tolerance allowance of 0.5 mm on the designated working face.

The new spinning roller and workpiece contact surface reinforcing layer is made of Ni625+WC2, in which WC is 25%.

A reinforcing layer having the thickness of 0.8 mm is clad with laser on the designated working face of the new spinning roller, the preheating temperature is controlled to 300 DEG C. before welding, and the laser process parameters include: laser power: 4000 W; scanning speed: 7 mm/s; spot diameter: 4 mm; overlapping rate: 40%; powder feeding rate: 10 g/min.

The new spinning roller laser clad reinforcing layer is rolled at the temperature of 1140 DEG C. under the force of 4 tons, so that the uniformity of the forged structure of the laser clad layer is effectively ensured and the residual tension stress is converted into residual compressive stress.

The rolled new spinning roller is put into a thermal treatment furnace for thermal treatment, and quenching and tempering treatment, re-crystallization and residual stress elimination are performed, in which the thermal treatment is performed stage by stage, the first heating temperature is 520 DEG C., the heat preservation time is 1 hour, the second temperature is raised to 820 DEG C. within 0.5 hour, the heat is finally preserved for 2 hours, the quenching temperature is 850 DEG C., the quenching time is 0.5 hour, the tempering temperature is 520 DEG C., the tempering time is 0.8 hour, and the medium is oil.

The new spinning roller after thermal treatment is finished to process the part except the working face reinforcing layer to the dimension and precision required by a spinning roller drawing; and the working face of the finished new spinning roller is ground to the dimension and precision required by the spinning roller drawing.

The service life of the spinning roller formed by the above steps is 300, 000 workpieces, and the material properties of the spinning part are shown as table 1 below.

TABLE 1

| Cast spun hub spinning part | Yield strength MPa | Tensile strength MPa | Elongation % |
|---|---|---|---|
| Inner rim | 222 | 293 | 12.2 |
| Rim | 221 | 296 | 13.4 |

It could be seen from table 1 that after the spinning roller manufactured in embodiment 1 spins workpieces, the material properties are relatively high, the consistency is good, and the overall quality of the wheel is improved.

Embodiment 2

A 35CrMo steel forging blank 1 with good weldability substitutes H13 steel and is used as the spinning roller blank of a new spinning roller for a wheel, the spinning roller is normalized after forging, the normalizing temperature is controlled to 880 DEG C., the heat preservation time is 55 minutes, and the spinning roller is cooled in air after being discharged.

The new spinning roller forging blank is roughly processed to reserve a tolerance allowance of 0.5 mm on the designated working face.

The new spinning roller and workpiece contact surface reinforcing layer is made of Ni625+WC2, in which WC is 26%.

A reinforcing layer having the thickness of 0.8 mm is clad with laser on the designated working face of the new spinning roller, the preheating temperature is controlled to 350 DEG C. before welding, and the laser process parameters include: laser power: 4200 W; scanning speed: 5 mm/s; spot diameter: 5 mm; overlapping rate: 35%; powder feeding rate: 12 g/min.

The new spinning roller laser clad reinforcing layer is rolled at the temperature of 1150 DEG C. under the force of 4.5 tons, so that the uniformity of the forged structure of the laser clad layer is effectively ensured and the residual tension stress is converted into residual compressive stress.

The rolled new spinning roller is put into a thermal treatment furnace for thermal treatment, and quenching and tempering treatment, re-crystallization and residual stress elimination are performed, in which the thermal treatment is performed stage by stage, the first heating temperature is 550 DEG C., the heat preservation time is 1 hour, the second temperature is raised to 860 DEG C. within 0.7 hour, the heat is finally preserved for 2.2 hours, the quenching temperature is 850 DEG C., the quenching time is 0.5 hour, the tempering temperature is 540 DEG C., the tempering time is 1 hour, and the medium is oil.

The new spinning roller after thermal treatment is finished to process the part except the working face reinforcing layer to the dimension and precision required by a spinning roller drawing; and the working face of the finished new spinning roller is ground to the dimension and precision required by the spinning roller drawing.

The service life of the spinning roller formed by the above steps is 312, 000 workpieces, and the material properties of the spinning part are shown as table 2 below.

TABLE 2

| Cast spun hub spinning part | Yield strength MPa | Tensile strength MPa | Elongation % |
|---|---|---|---|
| Inner rim | 223 | 296 | 13.2 |
| Rim | 221 | 295 | 12.5 |

It could be seen from table 2 that after the spinning roller manufactured in embodiment 2 spins workpieces, the material properties are relatively high, the consistency is good, and the overall quality of the wheel is improved.

Embodiment 3

A 35CrMo steel forging blank 1 with good weldability substitutes H13 steel and is used as the spinning roller blank of a new spinning roller for a wheel, the spinning roller is normalized after forging, the normalizing temperature is controlled to 870 DEG C., the heat preservation time is 50 minutes, and the spinning roller is cooled in air after being discharged.

The new spinning roller forging blank is roughly processed to reserve a tolerance allowance of 0.5 mm on the designated working face.

The new spinning roller and workpiece contact surface reinforcing layer is made of Ni625+WC2, in which WC is 27%.

A reinforcing layer having the thickness of 0.8 mm is clad with laser on the designated working face of the new spinning roller, the preheating temperature is controlled to 350 DEG C. before welding, and the laser process parameters include: laser power: 3500 W; scanning speed: 8 mm/s; spot diameter: 6 mm; overlapping rate: 44%; powder feeding rate: 8 g/min.

The new spinning roller laser clad reinforcing layer is rolled at the temperature of 1120 DEG C. under the force of 5 tons, so that the uniformity of the forged structure of the laser clad layer is effectively ensured and the residual tension stress is converted into residual compressive stress.

The rolled new spinning roller is put into a thermal treatment furnace for thermal treatment, and quenching and tempering treatment, re-crystallization and residual stress elimination are performed, in which the thermal treatment is performed stage by stage, the first heating temperature is 530 DEG C., the heat preservation time is 1.2 hours, the second temperature is raised to 840 DEG C. within 0.6 hour, the heat is finally preserved for 1.8 hours, the quenching temperature is 850 DEG C., the quenching time is 0.5 hour, the tempering temperature is 530 DEG C., the tempering time is 0.8 hour, and the medium is oil.

The new spinning roller after thermal treatment is finished to process the part except the working face reinforcing layer to the dimension and precision required by a spinning roller drawing; and the working face of the finished new spinning roller is ground to the dimension and precision required by the spinning roller drawing.

The service life of the spinning roller formed by the above steps is 305, 000 workpieces, and the material properties of the spinning part are shown as table 3 below.

TABLE 3

| Cast spun hub spinning part | Yield strength MPa | Tensile strength MPa | Elongation % |
|---|---|---|---|
| Inner rim | 220 | 295 | 12.8 |
| Rim | 224 | 297 | 12.4 |

It could be seen from table 3 that after the spinning roller manufactured in embodiment 3 spins workpieces, the material properties are relatively high, the consistency is good, and the overall quality of the wheel is improved.

Described above are merely preferred embodiments of the disclosure, and the patent scope of the disclosure is not limited thereto. Equivalent structures or equivalent process transformations made by using the specification of the disclosure or contents directly or indirectly applied in other relevant technical fields fall into the patent protection scope of the disclosure.

The invention claimed is:

1. A spinning roller surface laser reinforced processing forming method, wherein a 35CrMo steel forging blank is used as a blank of a spinning roller, the spinning roller is normalized during a normalizing process after the forging, a normalizing temperature is controlled to 860-880 DEG C., a heat preservation time of the normalizing process for the spinning roller is 40-60 minutes, and the spinning roller is cooled in air after being normalized;

the spinning roller is subjected to a process to reserve a tolerance allowance of 0.5 mm on a designated working face of the spinning roller;

a workpiece contact surface reinforcing layer for the spinning roller is made of a Ni625 and tungsten carbide (WC), wherein WC is more than 22%;

the workpiece contact surface reinforcing layer having a thickness of 0.8 mm is clad using a laser on the designated working face of the spinning roller, a preheating temperature for the spinning roller is controlled to 250-400 DEG C. before the cladding of the workpiece contact surface reinforcing layer using the laser, and parameters during the cladding of the workpiece contact surface reinforcing layer using the laser include: laser power: 1800-5000 W; scanning speed: 3-10 mm/s; spot diameter: 3-6 mm; overlapping rate: 30-50%; powder feeding rate: 5-15 g/min;

the workpiece contact surface reinforcing layer for the spinning roller is rolled at a temperature of 1120-1160 DEG C. under a force of 4-5 tons;

after the workpiece contact surface reinforcing layer is rolled, the spinning roller is put into a thermal treatment furnace for thermal treatment, and quenching and tempering treatment, re-crystallization and residual stress elimination are performed, wherein the thermal treatment is performed stage by stage, a first heating temperature for a first stage of the thermal treatment is 520-550 DEG C., a heat preservation time for the first stage is 1-1.2 hours, a second temperature for a second stage of the thermal treatment is raised to 820-880 DEG C. within 0.5-1.3 hours, the second temperature is preserved for 1.5-2.5 hours, a quenching temperature for the quenching is 850 DEG C., a quenching time for the quenching is 0.5 hour, a tempering temperature for the tempering treatment is 500-560 DEG C., a tempering time for the tempering treatment is 0.8-1.2 hours, and a medium for the quenching and tempering treatment is oil.

2. The spinning roller surface laser reinforced processing forming method of claim 1, wherein the spinning roller is normalized after the forging, the normalizing temperature is controlled to 860 DEG C., the heat preservation time of the normalizing process for the spinning roller is 60 minutes, and the spinning roller is cooled in air after being normalized;

the workpiece contact surface reinforcing layer for the spinning roller is made of the Ni625 and WC, wherein WC is more than 25%;

the workpiece contact surface reinforcing layer having the thickness of 0.8 mm is clad using the laser on the designated working face of the spinning roller, the preheating temperature for the spinning roller is controlled to 300 DEG C. before the cladding of the workpiece contact surface reinforcing layer using the laser, and the parameters during the cladding of the workpiece contact surface reinforcing layer using the laser include: laser power: 4000 W; scanning speed: 7 mm/s; spot diameter: 4 mm; overlapping rate: 40%; powder feeding rate: 10 g/min;

the workpiece contact surface reinforcing layer for the spinning roller is rolled at the temperature of 1140 DEG C. under the force of 4 tons;

after the workpiece contact surface reinforcing layer is rolled, the spinning roller is put into the thermal treatment furnace for the thermal treatment, and the quenching and tempering treatment is performed, wherein the thermal treatment is performed stage by stage, the first heating temperature for the first stage is 520 DEG C., the heat preservation time for the first stage is 1 hour, the second temperature for the second stage is raised to 820 DEG C. within 0.5 hour, the second temperature is preserved for 2 hours, the quenching temperature is 850 DEG C., the quenching time is 0.5 hour, the tempering temperature is 520 DEG C., and the tempering time is 0.8 hour.

3. The spinning roller surface laser reinforced processing forming method of claim 1, wherein the spinning roller is normalized after the forging, the normalizing temperature is controlled to 880 DEG C., the heat preservation time of the normalizing process for the spinning roller is 55 minutes, and the spinning roller is cooled in air after being normalized;

the workpiece contact surface reinforcing layer for the spinning roller is made of the Ni625 and WC, wherein WC is more than 26%;

the workpiece contact surface reinforcing layer having the thickness of 0.8 mm is clad using the laser on the designated working face of the spinning roller, the preheating temperature for the spinning roller is controlled to 350 DEG C. before the cladding of the workpiece contact surface reinforcing layer using the laser, and the parameters during the cladding of the workpiece contact surface reinforcing layer using the laser include: laser power: 4200 W; scanning speed: 5 mm/s; spot diameter: 5 mm; overlapping rate: 35%; powder feeding rate: 12 g/min;

the workpiece contact surface reinforcing layer for the spinning roller is rolled at the temperature of 1150 DEG C. under the force of 4.5 tons;

after the workpiece contact surface reinforcing layer is rolled, the spinning roller is put into the thermal treatment furnace for the thermal treatment, and the quenching and tempering treatment is performed, wherein the thermal treatment is performed stage by stage, the first heating temperature for the first stage is 550 DEG C., the heat preservation time for the first stage is 1 hour, the second temperature for the second stage is raised to 860 DEG C. within 0.7 hour, the second temperature is preserved for 2.2 hours, the quenching temperature is 850 DEG C., the quenching time is 0.5 hour, the tempering temperature is 540 DEG C., and the tempering time is 1 hour.

4. The spinning roller surface laser reinforced processing forming method of claim 1, wherein the spinning roller is normalized after the forging, the normalizing temperature is controlled to 870 DEG C., the heat preservation time of the normalizing process for the spinning roller is 50 minutes, and the spinning roller is cooled in air after being normalized;

the workpiece contact surface reinforcing layer for the spinning roller is made of the Ni625 and WC, wherein WC is more than 27%;

the workpiece contact surface reinforcing layer having the thickness of 0.8 mm is clad using the laser on the designated working face of the spinning roller, the preheating temperature for the spinning roller is controlled to 350 DEG C. before the cladding of the workpiece contact surface reinforcing layer using the laser, and the parameters during the cladding of the workpiece contact surface reinforcing layer using the laser include: laser power: 3500 W; scanning speed: 8 mm/s; spot diameter: 6 mm; overlapping rate: 44%; powder feeding rate: 8 g/min;

the workpiece contact surface reinforcing layer for the spinning roller is rolled at the temperature of 1120 DEG C. under the force of 5 tons;

after the workpiece contact surface reinforcing layer is rolled, the spinning roller is put into the thermal treatment furnace for the thermal treatment, and the quenching and tempering treatment is performed, wherein the thermal treatment is performed stage by stage, the first heating temperature for the first stage is 530 DEG C., the heat preservation time for the first stage is 1.2 hours, the second temperature for the second stage is raised to 840 DEG C. within 0.6 hour, the second temperature is preserved for 1.8 hours, the quenching temperature is 850 DEG C., the quenching time is 0.5 hour, the tempering temperature is 530 DEG C., and the tempering time is 0.8 hour.

* * * * *